United States Patent [19]

Klein et al.

[11] Patent Number: 4,874,110

[45] Date of Patent: Oct. 17, 1989

[54] LENS STRUCTURE FOR A COMBINED RADIO/AUDIO TAPE CASSETTE PLAYER OR THE LIKE

[75] Inventors: Frank H. Klein; Steven F. Selby; Sigmund Klueger, all of Huntsville, Ala.

[73] Assignee: Chrysler Motors Corporation, Highland Park, Mich.

[21] Appl. No.: 263,316

[22] Filed: Oct. 27, 1988

[51] Int. Cl.$^4$ .................... H02G 3/41; B65D 51/18
[52] U.S. Cl. ........................ 220/241; 220/377; 220/254; 312/7.1; 174/67; 369/10
[58] Field of Search .......... 220/82 R, 82 A, 254, 220/377, 334, 335, 337, 241, 242; 312/7.1; 174/66, 67; 116/24.1, 260; 369/10, 12

[56] References Cited

U.S. PATENT DOCUMENTS

| | | | |
|---|---|---|---|
| 3,619,477 | 11/1971 | Rasmussen | 220/241 |
| 4,167,702 | 9/1979 | Shichijo | 116/241 |
| 4,181,823 | 1/1980 | Delamoreaux | 369/10 |
| 4,322,780 | 3/1982 | Murakami | 369/12 |
| 4,448,327 | 5/1984 | Gahn | 220/341 |
| 4,545,483 | 10/1985 | Shiba | 220/82 R |
| 4,562,595 | 12/1985 | Bauer | 372/7.1 |
| 4,670,809 | 6/1987 | Teaber | 220/337 |

Primary Examiner—George E. Lowrance
Attorney, Agent, or Firm—Edward A. Craig

[57] ABSTRACT

A lens structure for a combined vehicle radio/audio tape cassette player or the like to premit display of information generated by the combined vehicle radio/audio tape cassette player is provided. The lens structure has a transparent forward panel and an opaque rearward panel heat fused thereto. The lens portion of the forward panel is not covered by the rearward panel thus providing a viewing lens. An opening is provided in the lens structure for insertion of an audio tape cassette. A spring mounted door is provided on the rearward panel. The door normally blocks the tape cassette opening.

6 Claims, 2 Drawing Sheets

LENS STRUCTURE FOR A COMBINED RADIO/AUDIO TAPE CASSETTE PLAYER OR THE LIKE

BACKGROUND OF THE INVENTION

1. Field of the Invention

This invention relates to a lens structure for a combined vehicle radio/audio tape cassette player or the like which includes a clear lens surrounded by an opaque field and a spring mounted door which normally blocks the tape cassette opening.

2. Description of the Prior Art

Lens structures of the type to which the present invention appertains are in common use for vehicle radios and audio tape cassette players. The lens structure is a plate-like element and includes a clear lens portion surrounded by an opaque field. The lens portion is for the display of information generated by the electronic equipment. This information may include, for example, the station to which the radio is tuned, whether the radio is set for AM or FM, whether the tape mode has been selected and the time of day.

In the past, such lens structures have been manufactured by first molding or otherwise preparing a clear plate of a scratch resistant glassy plastic material such as an acrylic resin. The rearward surface of this plate was then painted an opaque color, usually black, leaving a central clear lens area for the display of information.

This method of fabricating the lens structure has certain drawbacks. Firstly, the painted surface is easily scratched, thus necessitating very careful handling of the lens structure from the time it is painted to the time when it is installed. This results in costly procedures which are, however, not entirely effective, there being a relatively high scrap rate of such lens structures as a result of inadvertent scratching of the painted surface.

Additionally, it is difficult to propely paint such lens structures. In the painting process, a mask must be used to prevent painting the portion which is to remain clear. The mask gets paint on it and must be cleaned often to prevent making paint marks on the clear portion. Overall, this painting process also involves a relatively high scrap rate.

In accordance with the present invention, instead of painting the rear surface of the lens structure, a layer of opaque pigmented plastic material is heat molded onto the rear surface of the glassy panel. A clear lens portion projects through this opaque layer forming the desired lens.

Such a lens structure offers the advantage of ready quality control, there being no liquid paint to contend with. Additionally, the opaque layer, being pigmented and relatively thick, is not subject to easy scratching thereby resulting in a lower scrap rate and less expensive handling procedures. A further advantage of this construction is that a cheaper plastic can be used for the opaque layer than is used for the clear glassy layer.

Additionally, the lens structure permits a more efficient assembly process. In the past, because of the delicate nature of the lens structure, it has been mounted as a single unit to avoid damage to the painted surface. Such lens structures have an opening for insertion of a tape cassette. This opening is covered by a pivotally mounted door which is spring urged to the closed position. In the past, the assembly comprising the door, hinge pin and spring has been heat staked to the escutcheon of the cassette player with the lens structure then being separately mounted. In accordance with the present invention, the lens structure and door assembly are first preassembled into a component which is then mounted as a unit thereby improving assembly efficiency. This is made possible by the fact that the lens structure can endure the preassembly handling without being damaged.

SUMMARY OF THE INVENTION

A lens structure is provided for a combined vehicle radio/audio tape cassette player or the like to permit display of information generated by the combined vehicle radio/audio cassette player. The lens structure comprises a forward panel injection molded of a clear thermoplastic resin. The forward panel has an opening therein for insertion of an audio tape cassette. The forward panel has a forward surface and a rearward surface. A lens portion is provided on the rearward surface projecting rearwardly therefrom. The lens portion forms, with the contiguous forward portion of the forward panel, a lens.

A rearward panel is injection molded of an opaque thermoplastic resin onto the forward panel and heat fused to the portion of the rearward surface of the forward panel adjacent to, but not including, the rearward surface of the lens.

A door is pivotally mounted on the rearward panel by hinge structure over the tape cassette opening. Spring means urge the door to a normally closed position blocking the tape cassette opening. The hinge structure includes a hinge pin. First tab structure is provided on the door pivotally receiving the hinge pin. Second tab structure is provided on the rearward panel lockingly receiving the hinge pin.

The forward panel is preferably fabricated of an acrylic resin and the rearward panel is preferably fabricated of an acrylonitrile-butadiene-styrene or polycarbonate resin. The forward and rearward panels are preferably about 0.045 inch thick.

DESCRIPTION OF A PREFERRED EMBODIMENT

Figure 1:
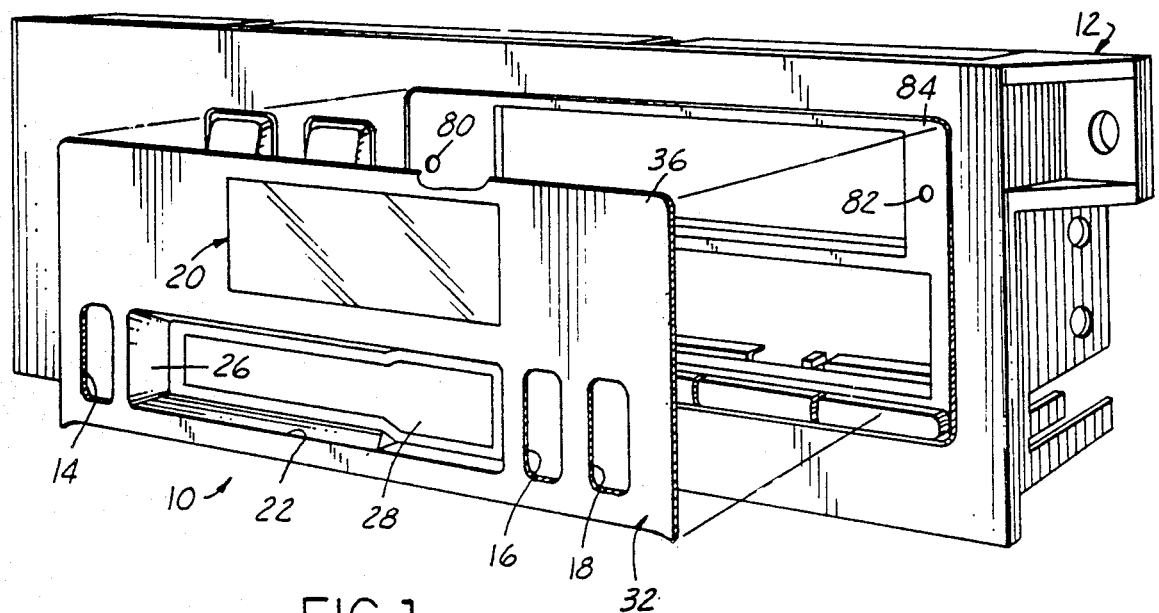
FIG. 1 is an exploded front view in perspective of the lens structure of the present invention prior to mounting it onto the housing which encloses a combined vehicle radio/audio tape cassette player.
Figure 2:
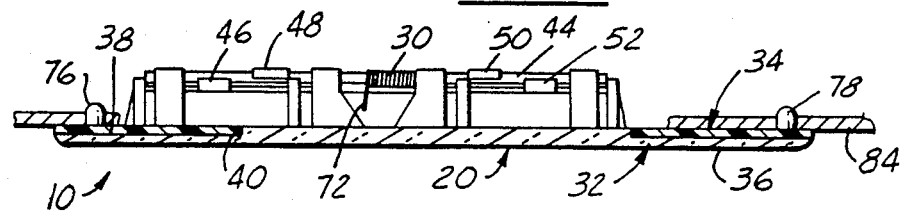
FIG. 2 is a longitudinal sectional view of the lens structure of FIG. 1 shown mounted onto the forward escutcheon of the housing.
Figure 3:
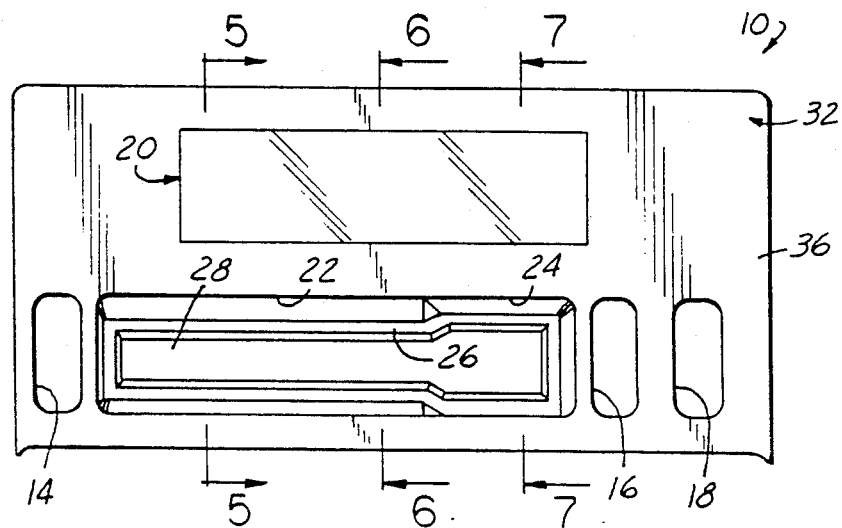
FIG. 3 is a front elevational view of the lens structure of FIG. 1.

Referring to the figures, it will be noted that the lens structure 10 is generally rectangular. The lens structure 10, in use, is positioned in front of a combined vehicle radio/audio tape cassette player as illustrated in FIGS. 1 and 2. The housing 12 of the unit is illustrated. The housing 12 encases the electronic/mechanical components (not shown) of the unit. The housing 12 is secured within an opening provided in the instrument panel of the vehicle. The lens structure 10 illustratively has three elongated slots 14, 16, 18 through which project operating buttons of the unit.

The function of the lens structure 10 is to permit viewing by the vehicle occupants of information generated by the radio/player unit. This information is of the usual type, consisting ordinarily of information relating to the operating condition of the unit such as whether the radio or audio tape cassette player has been activated, the station to which the radio is tuned, or other information as desired. A clear, transparent rectangular portion, constituting a lens 20, is provided centrally of the lens structure 10 adjacent the upper edge thereof. The lens 20 permits viewing the information above mentioned. This information is generated by, for example, a vacuum florescent display. The field surrounding the lens 20 is desirably opaque. Currently, the preferred color is black.

An elongated opening 22 is provided beneath the lens 20 for insertion of an audio tape cassette. The opening 22 is enlarged at one end 24 to conform to the shape of conventional cassettes. A wall structure 26 surrounds the opening 22 and projects rearwardly therefrom to define a chute for guiding an audio tape cassette upon insertion thereof into the audio tape player. A door 28 is pivotally mounted on the rearward side of the lens structure 10. The door 28 is urged to a normally closed position by means of a coiled torsion spring 30.

The lens structure 10 is composed of two layers or panels 32, 34. The panel 32 is characterized as a forward panel inasmuch as it is furtherest in front of the housing 12. The panel 34, being behind the panel 32, is characterized as a rearward panel.

The forward panel 32 includes a forward surface 36 and a rearward surface 38. A generally rectangularly lens portion 40 is provided on the rearward surface 38 and projects rearwardly therefrom. The lens portion 40 forms, with the contiguous forward portion of the forward panel 32, that is the portion of the panel immediately forward of the lens portion 40, the lens 20.

The forward panel 32 is fabricated of a transparent thermoplastic resin, preferably an acrylic resin. Acrylic resins have the desired properties of being glassy and transparent and are relatively hard so as to resist scratching.

The rearward panel 34 is fabricated of an opaque thermoplastic resin, preferably acrylonitrile-butadiene-styrene or polycarbonate. This resin is pigmented so as to result in the panel 34 being opaque. The preferable pigmentation is black.

Referring to FIGS. 2 and 4-7, it will be noted that the door 28 is pivotally mounted on an elongated hinge pin 44. The door 28 has two pairs of oppositely disposed, spaced apart bearing tabs 46, 48, 50, 52 which pivotally mount the door onto the pin 44. The pin 44 is secured to the lens structure 10 by means of four spaced apart tabs 54, 56, 58, 60 which extend outwardly from the rearward panel 34 and, as will be noted in FIG. 7, have re-entrant openings 62 to secure the pin 44 in place. A support tab 64, 66 is provided on either side of the center tabs 56, 58 as will be noted in FIG. 5. Stop tabs 68, 70 are provided outwardly of each of the tabs 54, 60 to prevent longitudinal displacement of the hinge pin 44. The spring 30 is received on the pin 44 between the tabs 56, 58. The spring has one arm 72 which bears against rearward panel 34 and a second arm 74 which bears against the door 28 as will be noted in FIGS. 2 and 6. The spring pressure exerted by the arm 74 urges the door 28 to the normally closed position shown in FIG. 6.

The lens structure 10 is preferably fabricated by an injection molding process involving the use of elevated temperatures. First, the forward panel 32 is molded. Then the rearward panel 34 is molded directly onto the rearward surface 38 of the forward panel 32. It is necessary that both the forward panel and rearward panel be fabricated of a thermoplastic resin in order that the rearward panel 34 will heat fuse to the portion of the rearward surface 38 of the forward panel adjacent to, but not including, the rearward surface of the lens portion 40 (although heat fusing will take place along the side edges of the lens portion 40). The panels 32, 34 may be fabricated in two-step process in a two color molding machine. Alternately, the fabrication process could take place using two separate molds.

Figure 4:
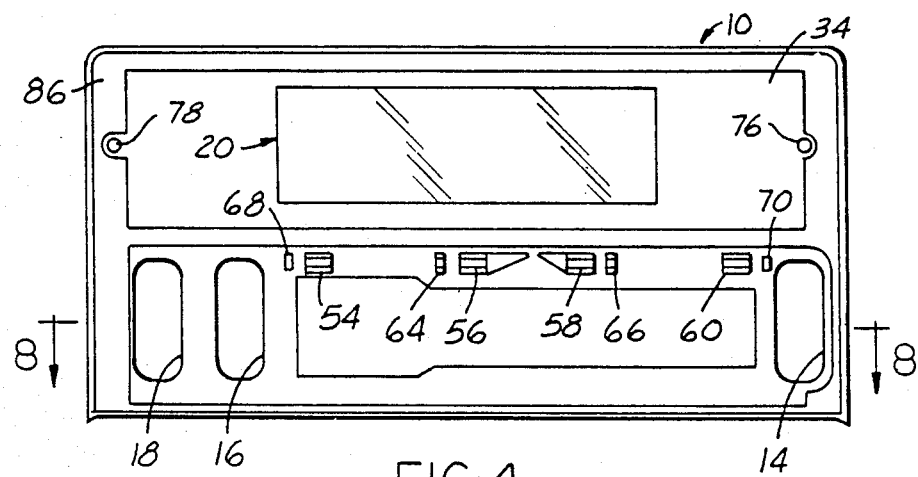
FIG. 4 is a rear elevational view of the lens structure of FIG. 1 with the tape cassette door, hinge pin and spring removed.
Figure 5:
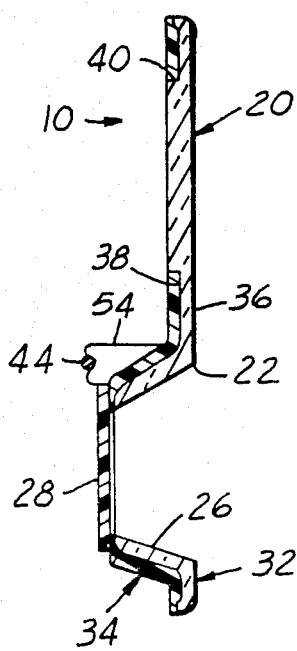
FIG. 5 is a sectional view taken substantially along the line 5—5 of the FIG. 3 looking in the direction of the arrows.
Figure 6:
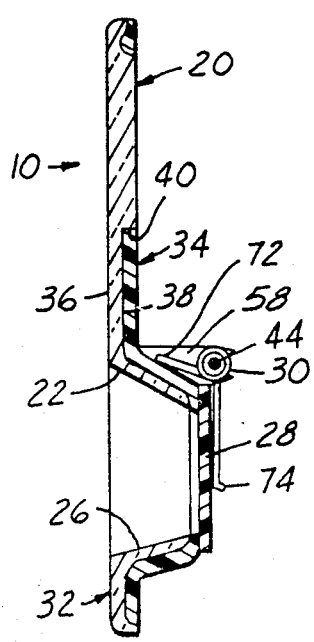
FIG. 6 is a sectional view taken substantially along the line 6—6 of FIG. 3 looking in the direction of the arrows.
Figure 7:
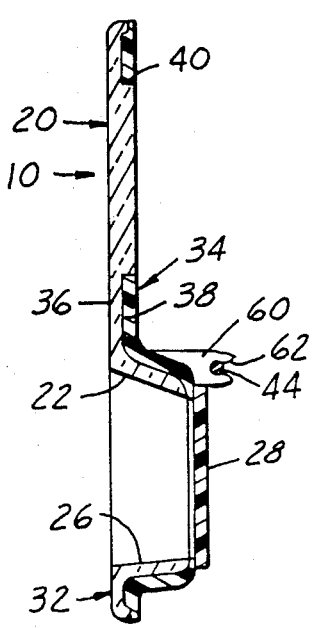
FIG. 7 is a sectional view taken substantially along the line 7—7 of FIG. 3 looking in the direction of the arrows.
Figure 8:
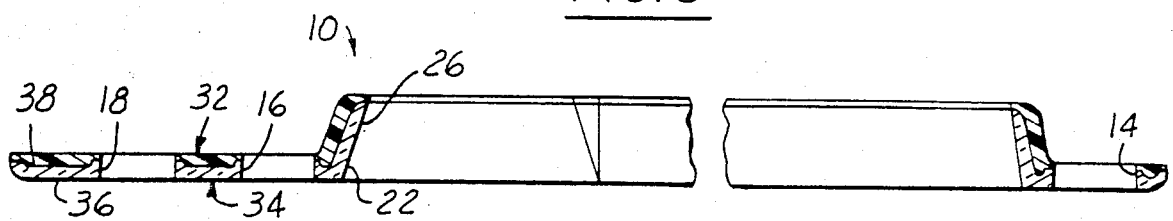
FIG. 8 is a sectional view taken substantially along the line 8—8 of FIG. 4 looking in the direction of the arrows.

Referring to FIGS. 1, 2 and 4, it will be noted that a pair of locating pins 76, 78 project rearwardly from the rearward panel 34. These pins are received in openings 80, 82 provided in the escutcheon 84 of the housing 12. An adhesive material 86 is provided on the rearward panel 34 to firmly secure the lens structure 10 to the escutcheon 84 and thus to the housing 12.

Preferably, the panels 32, 34 are each of substantial thickness. For example, these panels may be about 0.045 inch thick. This thickness level is important not only from a structural standpoint, but also to prevent observable scratches, particularly with reference to the rearward panel 34. The lens portion 40 may also be 0.045 inch thick so that it will match the thickness of the rearward panel 34.

We claim:

1. A lens structure for a combined vehicle radio/audio tape cassette player or the like to permit display of information generated by the combined vehicle radio/audio tape cassette player, the lens structure comprising a forward panel injection molded of a clear thermoplastic resin, the forward panel having an opening therein for insertion of an audio tape cassette, the forward panel having a forward surface and a rearward surface, a lens portion on said rearward surface projecting rearwardly therefrom, the lens portion forming, with the contiguous forward portin of the forward panel, a lens, a rearward panel injection molded of an opaque thermoplastic resin onto the forward panel and heat fused to the portion of the rearward surface of the forward panel adjacent to, but not including, the rearward surface of said lens, a door, hinge structure pivotally mounting the door on the rearward panel over the tape cassette opening, and spring means urging the door to a normally closed position blocking the tape cassette opening.

2. A lens structure as defined in claim 1, further characterized in that the hinge structure comprises a hinge pin, first tab structure on the door pivotally receiving the hinge pin, and second tab structure on the rearward panel lockingly receiving the hinge pin.

3. A lens structure as defined in claim 1, further characterized in that the forward panel is fabricated of an acrylic resin.

4. A lens structure as defined in claim 1, further characterized in that the rearward panel is fabricated of a polycarbonate.

5. A lens structure as defined in claim 1, further characterized in that the rearward panel is fabricated of an acrylonitrile-butadiene-styrene resin.

6. A lens structure as defined in claim 1, further characterized in that each of the forward and rearward panels are about 0.045 inch thick.

* * * * *